United States Patent [19]

Gupta et al.

[11] Patent Number: 5,065,368
[45] Date of Patent: Nov. 12, 1991

[54] VIDEO RAM DOUBLE BUFFER SELECT CONTROL

[75] Inventors: Satish Gupta, Peekskill; Randall L. Henderson, West Hurley, both of N.Y.; Nathan R. Hiltebeitel, South Burlington, Vt.; Robert Tamlyn; Steven W. Tomashot, both of Jericho, Vt.; Todd Williams, Essex Junction, Vt.

[73] Assignee: International Business Machines Corporation, Armonk, N.Y.

[21] Appl. No.: 352,442

[22] Filed: May 16, 1989

[51] Int. Cl.[5] .............................................. G11C 8/00
[52] U.S. Cl. ........................... 365/230.05; 365/230.09; 365/239
[58] Field of Search ...................... 365/189.05, 230.05, 365/230.09, 233, 239, 240

[56] References Cited

U.S. PATENT DOCUMENTS 4,825,411 4/1989 Hamano ........................ 365/233 X
4,855,959 8/1989 Kobayashi ........................ 365/239

Primary Examiner—Joseph A. Popek
Attorney, Agent, or Firm—W. A. Kinnaman, Jr.; M. S. Walker

[57] ABSTRACT

An implementation of a serial access memory register that facilitates the selecting from two alternate frame buffers on a per pixel basis. The frame buffers are each stored in a portion of a row in a single video RAM. Following data transfer to the serial access memory register, data from each of the two frame buffers is available. A double buffer select signal controls the selection of which half of the serial access memory register will put data on the output bus for each serial clock signal. The serial clock increments the address pointers in both halves of the serial access memory port simultaneously.

8 Claims, 5 Drawing Sheets

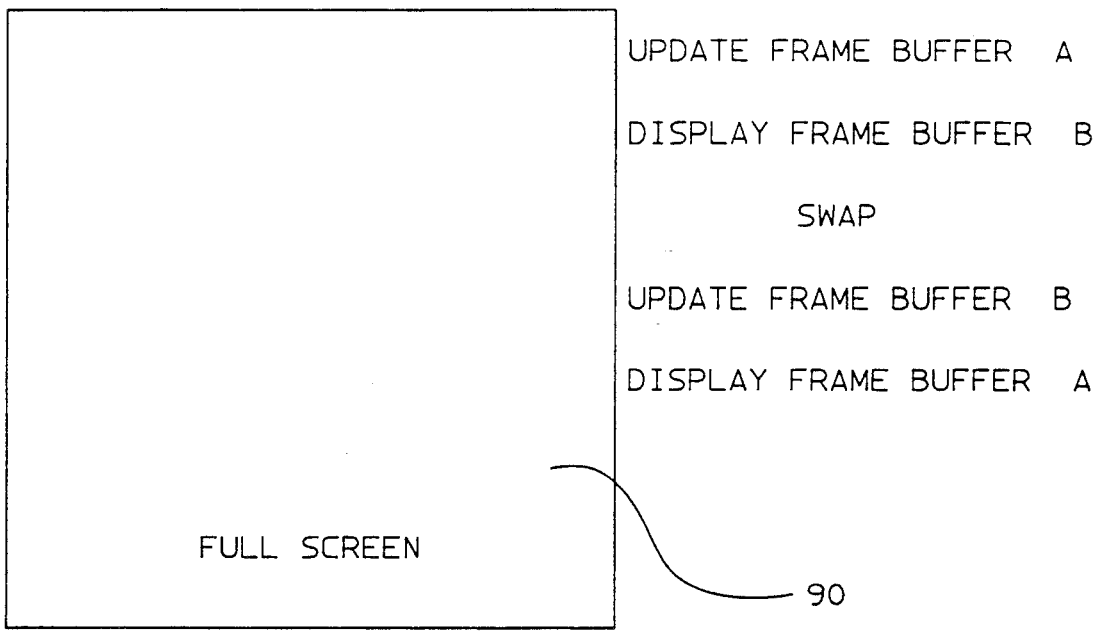
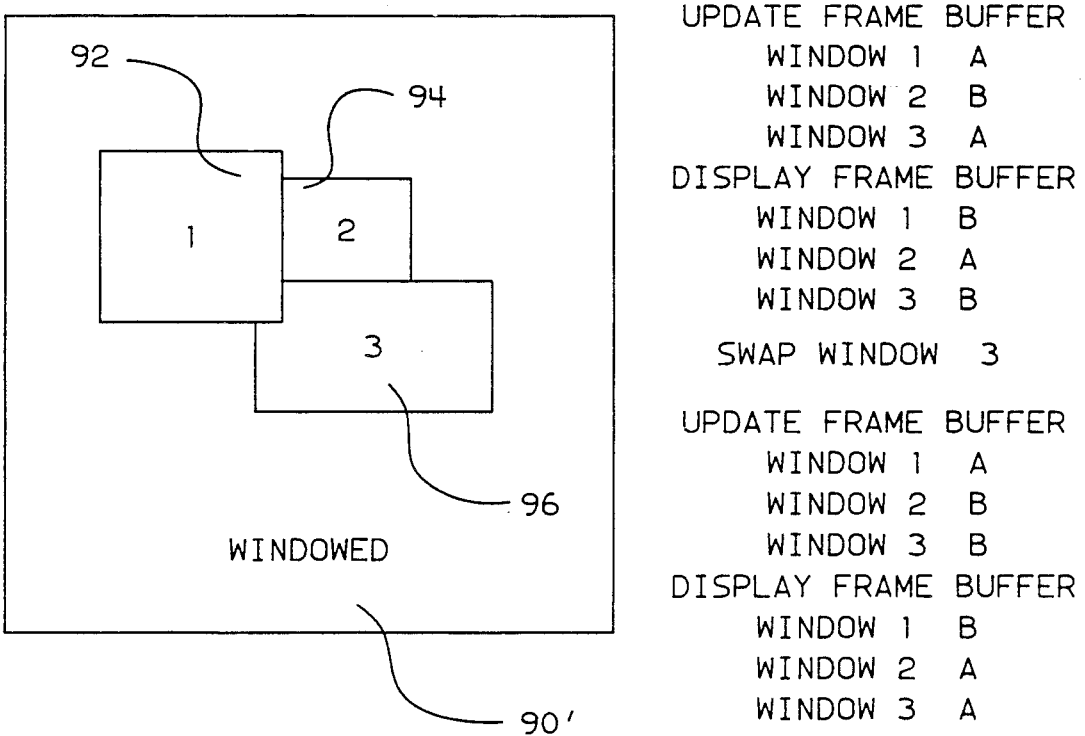

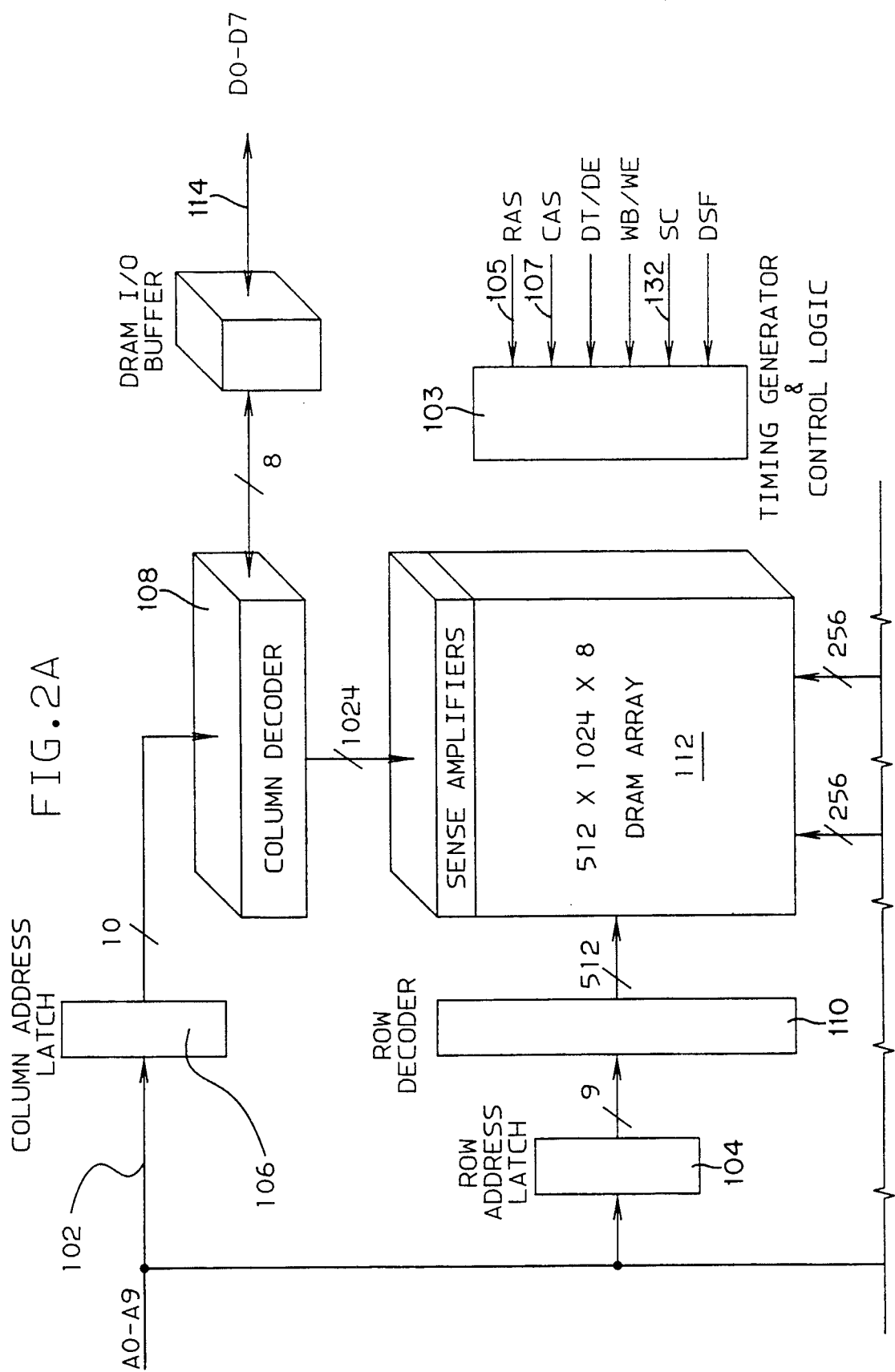

VIDEO RAM DOUBLE BUFFER SELECT CONTROL

CROSS REFERENCE

This application is related to a patent application having Ser. No. 07/352,802, filed concurrently.

BACKGROUND OF THE INVENTION

1. Field of the Invention

The present invention relates to semiconductor memories, and more specifically to dual-ported memories including a memory array capable of being accessed randomly and a serial access register capable of serial data transfer to and from the memory. The dual-ported two-dimensional memory of this type is commonly referred to as a video RAM.

2. Background of the Invention

The dual-ported memory of the type discussed in this application is used, for example, for storing picture data to be input to a cathode ray tube. The picture data is randomly accessed to write or update the image in memory and then subsequently accessed serially to generate the image on a cathode ray tube. A memory of this type can store images captured by a video camera or other scanning device or it may be used to store images generated by a graphics system.

The image to be displayed is divided into a number of discrete picture elements or pixels. Each pixel represents a physical position on the output display monitor and can have associated with it a color or specific shade of gray. In image and graphics systems the pixels of a display are each represented by a value stored in memory device. This memory representation of a display is typically referred to as a frame buffer. A high resolution display, such as the IBM 5080 Graphics System, typically has an image of 1024×1024 or 1,048,576 pixels. Each pixel value can be represented by 1 to 24 or more bits thus requiring a large amount of memory to store the image. This requirement for large amounts of high speed memory (even by modern standards) leads to the use of the highest density memory parts available for graphic system devices. Typically, Dynamic Random Access Memories ("DRAMs") provide the highest memory density. The nature of video display scan patterns and update rates pointed to a need for even faster access times and a need to decouple the updating of the frame buffer from the scanning out of the stored values (through video generation circuitry) for display on the video monitor.

Video RAMs are a specialized form of Dynamic RAM memories They were designed to solve the problem of simultaneously displaying the contents of a graphics frame buffer to the screen while allowing the graphics or image processor to update the frame buffer with new data. Video RAMs contain two Input/Output ports (one for random access and one for serial access) and one address port. These memories are frequently referred to as dual-port memories. In addition to the standard DRAM random access array of rows and columns, a Serial Access Memory register has been added to support serial input and output.

Video RAMs of this type are known in the prior art, for example U.S. Pat. No. 4,541,075 to Dill et al. describes such a memory device. The graphics or image processor updates the frame buffer by writing into the random access array. The serial access memory (SAM) register is designed to sequentially shift the contents of its buffer to the display independently of the random access array. The only time the random array and the SAM do not operate independently is when the SAM needs to be loaded with new data from the random array. The SAM is loaded by executing a special memory cycle called a Read Data Transfer which copies an entire row of the data to be sequentially clocked out of the SAM into circuitry which updates the screen. The clock rate of the SAM is typically between 3-4 times faster than a standard random access cycle.

Second generation VRAMs were enhanced with the ability to transfer half a row of random access memory into half of the SAM while the other half of the SAM is being scanned out to the display. This is known as a split row transfer. An output status pin known as QSF is typically provided to indicate the half of the SAM being scanned out.

In some systems there are two frame buffers, with one being scanned out to the screen while the other is being updated by the graphics or image processor. The use of two buffers avoids the problem of scanning a partially updated image to the screen resulting in undesirable partial images. This is frequently referred to as a double buffered system. In double buffered systems the two Frame Buffers are referred to as Frame Buffer A, FBA, and Frame Buffer B, FBB. One application of graphics displays is to segment the screen into a plurality of windows which are independent portions of the screen that each display data from a separate application or other subset of data. Because each window is independent of the others, the current update buffer and the display buffer may differ for different windows. Thus, at a moment on time, one window can be using Frame Buffer A for update and Frame Buffer B for display while another window can be using the reverse. This leads to the requirement that the scan out buffer be selectable on a per pixel basis.

A graphics system that does not employ windowing, may have a single full screen display 90 as shown in FIG. 1A. One frame buffer, for example frame buffer B will be displayed while a second one, frame buffer A is being updated. In a certain point in time the designation of the buffers will be swapped so that the frame buffer A is being displayed while frame buffer B is being updated.

FIG. 1B illustrates the use of a windowed system. Full screen 90' may be made up of several windows such as those labeled 92, 94 and 96. Each application will maintain an indication of which frame buffer is being used for update and which is being used for display. Initially window 1 may be updating frame buffer A, window 2 frame buffer B, and window 3 frame buffer A. The initial display would be window 1 from frame buffer B, window 2 from frame buffer A, and window 3 from frame buffer B. Upon the swapping of window 3 between frame buffers, updates from window 1 would be into frame buffer A, window 2 frame buffer B, and window frame buffer B, while the display will be from buffers B, A, and A respectively. While the purpose of double buffered systems is to have a separate update buffer from the display buffer, the flexibility exists to update and display from the same buffer.

One method of implementing double buffered systems is to put the two frame buffers in separate VRAMs. With separate VRAMs it is relatively easy to synchronize the two SAM registers and select pixel data from one or the other part on a per pixel basis. This can be done, for example, by using the Serial Output Enable control pin to only enable the data from the desired frame buffer.

Two potential problems exist with putting the two frame buffers in separate VRAMs. First, for low resolution screens one large VRAM, e.g. 4 Mbit, could hold both frame buffers. Two VRAMs for separate frame buffers would double the frame buffer parts cost. Second, for high performance systems, the drawing rate to the frame buffer can be increased by writing multiple pixels in parallel. If the frame buffers are separate only half of the available VRAMs can te updated in parallel. For example three 4 Mbit VRAMs are required to represent a 1280×1024 pixel frame buffer. Two frame buffers would require 6 VRAMs. As separate frame L buffers only the 3 VRAMs of frame buffer A or frame buffer B could be updated. If portions of each frame buffers resided in each module, then all 6 VRAMs could be updated in parallel, effectively doubling the drawing rate.

The problem solved by the present invention arises from a need to selectively scan out from FBA or FBB on a per pixel basis when both frame buffers reside in the same VRAM. The organization of the SAM in prior art devices does not provide a means to select data from FBA or FBB on a per pixel basis. The selection must be done externally requiring a higher data rate and extra circuitry.

SUMMARY OF THE INVENTION

The present invention is related to the implementation of a Serial Access Memory, SAM, register that facilitates selecting from FBA or FBB on a per pixel basis. Frame buffer A can be stored in one half of a row while frame buffer B can be stored in the other half of the same row. Following a Read Data Transfer both frame buffer A and B data is available in separate halves of the SAM register. A Double Buffer Select control pin is provided to select the half of the SAM to put data on the serial bus at each Serial Clock, SC, signal. To keep the corresponding pixel in both frame buffers in synchronization, the serial clock simultaneously increments the address pointer in both halves of the SAM port.

BRIEF DESCRIPTION OF THE DRAWING

FIGS. 1A and 1B illustrate the use of windows and the use of double frame buffers according to the present invention.

FIGS. 2A and 2B are a block diagram of a video RAM constructed according to the preferred embodiment of the present invention.

DETAILED DESCRIPTION OF THE PREFERRED EMBODIMENT

Figure 2B:
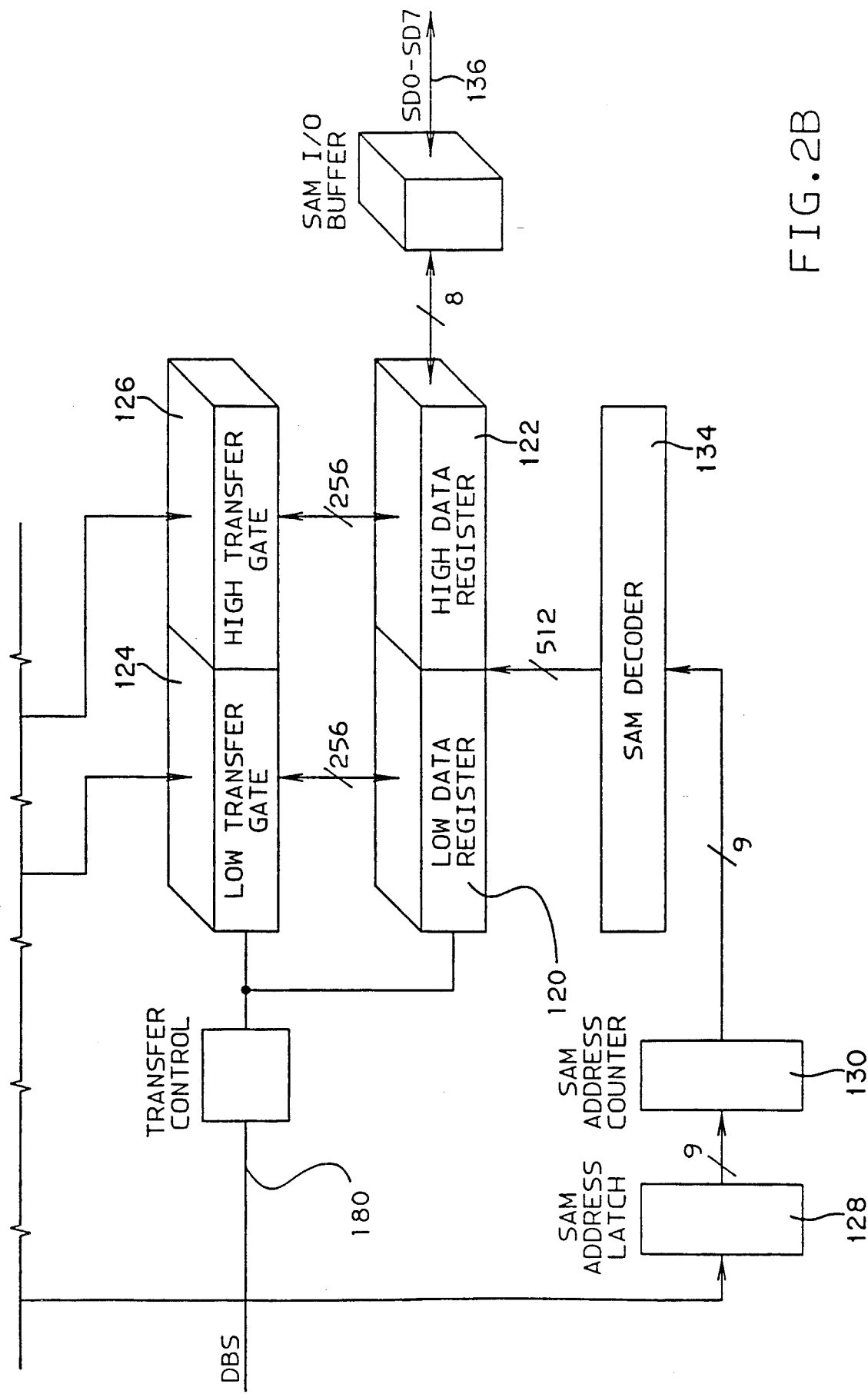

A VRAM is an enhanced DRAM. The DRAM portion of a VRAM operates in a manner similar to known DRAM devices. The DRAM portion is shown in of FIG. 2A. To save pins the addresses for rows and columns are multiplexed on address lines 102. Control signals RAS 105 and CAS 107 determine (via control logic 103) when to latch the address on the input pins into either the row address latch 104 or the column address latch 106. These latched addresses are decoded by column decoder 108 and row decoder 110 to point to one of the memory cells in the DRAM array 112. This cell is now selected to be read from or written to using, for example, the eight data Input/Output lines, D0–D7 114.

FIG. 2B shows is the additional circuitry that makes a DRAM into a VRAM. The major elements of this circuitry are the Low and High Data Registers 120, 122, also known as the Serial Access memory registers (SAM). In the preferred embodiment, a 4 Mbit VRAM, each 1024 element row is broken into two groups of 512 columns each. The selection of each group is done by the highest order bit of the latched column address 106. The SAM port is 512 columns wide and only connects to one group of columns at a time. (While 4 Mbit VRAMs are discussed, the invention is not constrained to any particular density or organization of VRAM.)

Two pieces of circuitry are necessary to support the operation of the SAM. One is the transfer gates 124, 126. These gates are used to tie the selected row to the SAM register during a Data Transfer operation. A Data Transfer is a special VRAM cycle that transfers data between a row in DRAM array 112 and the SAM registers 120, 122. During the Data Transfer cycle the row address 104 is used to select which row to transfer. Since all the columns in a group will be transferred the column address is not needed and is not latched. Instead the column address input is latched into the SAM address latch 128 and is used as a starting address, or tap, for the SAM.

The SAM is a sequential serial port so the addressing is generated by a counter. The SAM address latch is loaded into the SAM address counter 130 to set a starting address. Each subsequent Serial Clock cycle, SC 132, clocks the counter and points to the next register location (via SAM decoder 134) to supply data on the serial data I/O lines, SD0–SD7 136.

One of the enhancements over first generation VRAMs is the ability to operate on half of the SAM independently from the other half. Second generation VRAMs have added a special cycle called a Split Data Transfer. This cycle breaks the 512 columns selected into two halves of 256 columns. Each half of 256 columns can be loaded into the SAM independent of the other half. Each half of the SAM also has its own tap address. Present VRAMs indicate which half of the SAM is actively being addressed by a status output QSF. These VRAMs start at the tap address and continue incrementing until the boundary, e.g. at 255 or 511 is reached. At this point a new tap address is loaded from the SAM address latch and QSF switches (i.e. from high to low or vice versa).

A number of SAM Address Counter 130 configurations can be used to generate the SAM addresses. One such method is to have two 8-bit counters that each generate 256 addresses. One of the counters generates even addresses from 0 to 510. The second counter generates odd addresses from 1 to 511. The selection of the odd or even counter to supply the address is done by the 9th bit of the SAM address latch. A counter of this type is shown in FIG. 3.

Figure 3:
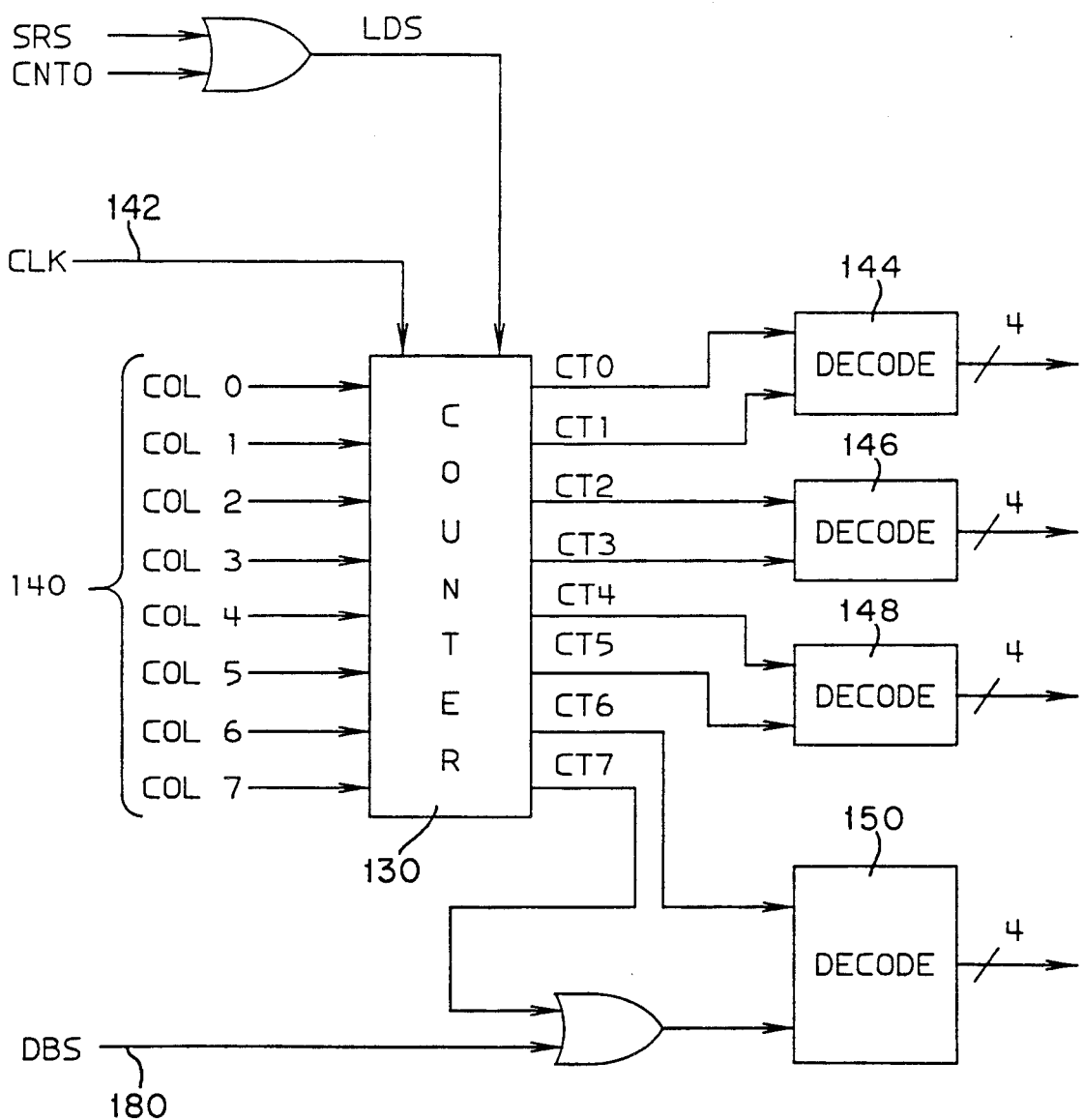
FIG. 3 is a block diagram of the counter employed in the preferred embodiment of the present invention.

The counter shown in FIG. 3 represents one of the two counters that would be used to generate the SAM addresses. The starting point or tap address from SAM address latch 128 is loaded into the counter to initialize the counter on lines 140. The counter is incremented by clock signal 142 generated by the control logic 103. Individual decoders 144, 146, 148 and 150 each provide four bits of the output address. While the preferred embodiment employs this form of dual counter, the present invention is in no way limited to implementation using this form of counter. For example, a single counter generating the full nine bit address could be employed as well.

The preferred embodiment of the present invention replaces the QSF status output with an input control pin DBS, Double Buffer Select. DBS would control the high order count:er bit to the address decode 134. The net effect is to select the half of the SAM to be active on a per Serial Clock; basis. Stated another way, the addresses to both halves of the SAM are beino clocked synchronouslv, on each serial clock cycle. The data to be transmitted on data lines 136 is selected from one half or the other based upon the DBS signal. This embodiment implements address selection.

Figure 4A:
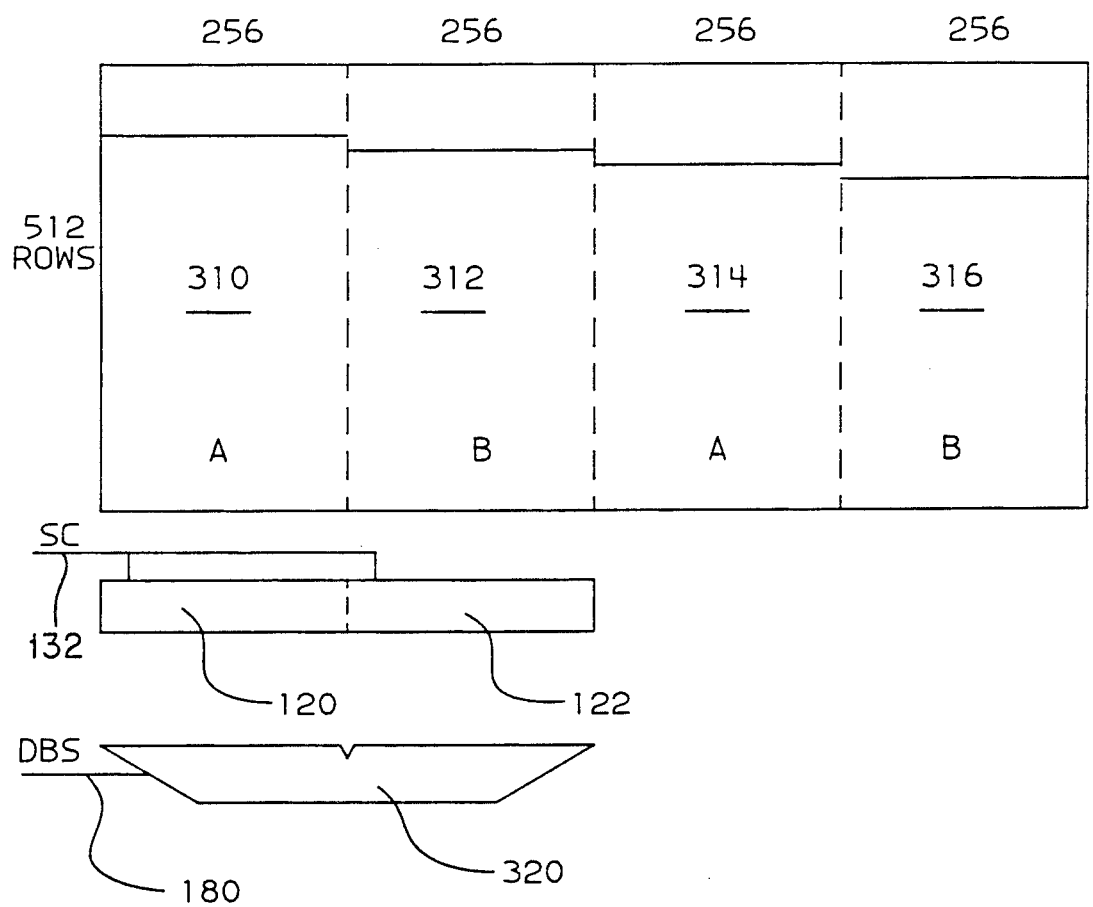
FIG. 4A and 4B are diagrams illustrating the application of the technique of the present invention.
Figure 4B:
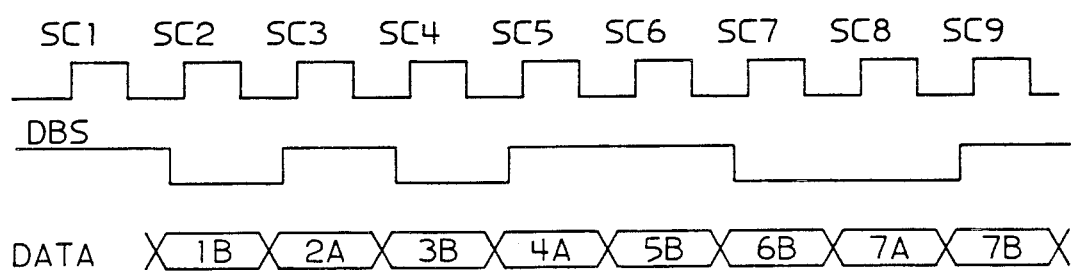

FIG. 4 shows a conceptual representation of the architecture and a timing diagram. The preferred embodiment of the present invention stores one frame buffer, e.g. Frame Buffer A 310, 314, in the lower 256 columns and the opposite frame buffer in the higher 256 columns, e.g. Frame Buffer B 312, 316 of each half of DRAM array 112. Following a row transfer FBA and FBB would be available in separate halves of the SAM. A control pin Double Buffer Select 180 (DBS) selects the half of the SAM to put data on the serial bus on a per Serial Clock, SC, basis. In an alternate embodiment, as shown, selection is accomplished by means of multiplexer shown in FIG. 4. This is referred to as data selection. The DBS signal 180 selects for output either the pixel value in SAM 120 or that in SAM 122. Data selection requires that the Serial Clock signals be applied to both halves of the SAM thereby accessing a pixel from each SAM reqister on each clock cycle.

The lower portion of FIG. 4 illustrates the timing diagram illustrating the per pixel selection occurring through the use of the DBS control signal. The top line of the timing diagram shows serial clock signal. These signals SCl, SC2 et seq. each increment the pixel counter in SAM registers 120 and 122. The middle line in the timing diagram in FIG. 4 illustrates the DBS signal. In the preferred embodiment using address selection, the DBS signal level selects which buffer is to output pixel data to the SAM address lines. As shown in the figure, initial output data is pixel 1 from frame buffer B, followed by pixel 2 from frame buffer A. A changed level of DBS causes pixel 3 to be output from frame buffer B when the followino is output from frame buffer A. Thus, by controlling the value of DBS, the appropriate buffer can be selected for outout data. DBS can be controlled through a variety of known mechanisms. For example, a separate memorv may be maintained which indicates the extent of each window on the screen and the value of the display buffer. A signal representing the display buffer associated with each window can be used as the DBS signal to ensure appropriate selection of DBS of the data to be output.

The present invention has been described in terms of a particular embodiment. However, it will be apparent to those skilled in the art that various substitutions of components can be made without changing the invention. The alternative embodiments thus achieved are considered to fall within the present invention.

We claim:

1. A dual-port memory comprising:
   a memory array having a plurality of memory elements each of which is accesses at random by a row and column address input to enable writing in or reading out of data at said row and column location;
   first and second serial access memory means, each selectively accessing a specified portion of the data of a row of said memory elements in parallel;
   control means for serially transferring data between said first and second serial access memory means and an output port in synchronism with a clock signal; and
   selection means for selectively actuating said control means to couple said first or secod serial access memory means to said output port, said selection means being responsive to a selection control signal which may be varied arbitrarily between successive cycles of said clock signal to select a particular one of said serial access memory means.

2. The dual-port memory of claim 1 wherein said selection means comprises a serial access address means for generating an address in either said first or second serial access memory means, and wherein said selection control signal determines which serial access memory means said address will access.

3. The dual-port memory of claim 2, wherein said serial access address means comprises two serial address counters each generating interleaved serial access memory addresses and wherein said selection control signal modifies each of said two addresses to access said first or second serial access memory means.

4. The dual-port memory of claim 1 wherein said selection means comprises a multiplxer responsive to said selection control signal.

5. In a semiconductor memory array having elements arranged in rows and columns, wherein said columns are grouped into first and second frame buffers, and wherein said first and second frame buffers each represent a plurality of picture elements on a display device, a method for serially accessing said semiconductor memory to present an element from either said first or said second frame buffer comprising the steps of:
   decoding a row address to select a row of memory elements;
   loading a portion of said row representing a first frame buffer into a first serial access memory register;
   loading a portion of said row representing a second frame buffer into a second serial access memory register;
   applying a clock signal to said first and second serial access memory registers to access an element in each register corresponding to a given display device picture element; and
   applying selection signal to select which of said elements to output through an output port, said selection signal being arbitrarily variable between successive cycles of said clock signal to select a particular one of said registers.

6. In a semiconductor memory array having elements arranged in rows and columns, wherein said columns are grouped into first and second frame buffers, and wherein said first and second frame buffers each represent a plurality of picture elements on a display device, a method for serially accessing said semiconductor memory to present an element from either said first or said second frame buffer comprising the steps of:
   decoding a row address to select a row of memory elements;

loading a portion of said row representing a first frame buffer into a first serial access memory register;

loading a portion of said row representing a second frame buffer into a second serial access memory register;

generating a serial access address in response to a clock signal;

modifying said serial access address by applying a selection signal to select said first or second serial access memory register, said selection signal being arbitrarily variable bewteen successive cycles of said clock signal to select a particular one of said registers; and accessing a picture element at said modified address and transferring said element to an output port.

7. In a dual-port memory comprising a random access memory array having a plurality of rows and columns and respective locations corresponding to the intersections of said rows and columns, means for coupling the location corresponding to a row address input and a column address input to a first port, a plurality of serial access memory registers, each of which has columns corresponding to columns of said array, and means for transferring data in parallel between a selected row of said memory array and said registers, a method of controlling the serial transfer of data between said registers and a second port, said method including the steps of storing a count corresponding to a colyumn of a selected one of said registers, indexing said count in synchronism with a clock signal to address successive columns of the selected register, generating a selection control signal independently of said count for selecting one of said registers, and coupling said second port to the column corresponding to said count of the register selected by said control signal, whereby different registers may be accessed on successive counts in accordance with said control signal.

8. A dual-port memory comprising a random access memory array having a plurality of rows and columns and respective locations corresponding to the intersections of said rows and columns, means for coupling the location corresponding to a row address input and a column address input to a first port, a plurality of serial access memory registers, each of which has columns corresponding to columns of said array, means for transferring data in parallel between a selected row of said memory array and said registers, and means for controlling the serial transfer of data between said registers and a second port, said controlling means including means for storing a count corresponding to a column of a selected one of said registers, means for indexing said count in synchronism with a clock signal to address successive columns of the selected register, means for generating a selection control signal independently of said count for selecting one of said registers, and means for coupling said second port to the column corresponding to said count of the register selected by said control signal, whereby different registers may be accessed on successive counts in accordance with said control signal.

* * * * *